United States Patent [19]

Someno et al.

[11] Patent Number: 5,093,150
[45] Date of Patent: Mar. 3, 1992

[54] SYNTHESIS METHOD BY PLASMA CHEMICAL VAPOR DEPOSITION

[75] Inventors: Yoshihiro Someno, Miyagi; Toshio Hirai; Makoto Sasaki, both of Sendai, all of Japan

[73] Assignee: Alps Electric Co., Ltd., Tokyo, Japan

[21] Appl. No.: 493,561

[22] Filed: Mar. 14, 1990

[30] Foreign Application Priority Data

Apr. 20, 1989 [JP] Japan .................................. 1-102250

[51] Int. Cl.$^5$ ............................................. B05D 3/06
[52] U.S. Cl. ...................................... 427/38; 427/45.1
[58] Field of Search .................................. 427/38, 45.1

[56] References Cited

U.S. PATENT DOCUMENTS 4,937,094  6/1990  Doehler et al. ........................ 427/38
4,965,090 10/1990  Gartner et al. .................... 427/38 X

OTHER PUBLICATIONS

Plasma-Enhanced Chemical Vapour Deposition of AIn Coatings on Graphite Substrates—Thin Solid Films 146 (1987) 255-264; H. Itoh, M. Kato, K. Sugiyama.

Primary Examiner—Bernard Pianalto
Attorney, Agent, or Firm—Guy W. Shoup; Norman R. Klivans; David E. Steuber

[57] ABSTRACT

A method of synthesizing metal-containing material by a plasma chemical vapor deposition comprises converting a reactive gas containing metal atoms into plasmas in a reaction chamber and supplying an inert gas from outside the plasma region in the reaction chamber. Ceramic films of excellent quality can be synthesized under stable conditions in an industrial mass production process.

4 Claims, 3 Drawing Sheets

SYNTHESIS METHOD BY PLASMA CHEMICAL VAPOR DEPOSITION

BACKGROUND OF THE INVENTON

1. Field of the Invention

The present invention concerns a synthesis method by plasma chemical vapor deposition for synthesizing thin films or depositing powders on the surface of a substrate by utilizing plasmas and, more in particular, it relates to a synthesis method by plasma chemical vapor deposition capable of stabilizing plasmas and synthesizing thin films such as of aluminum nitride with preferred oriented crystals.

2. Description of the Prior Art

Among ceramic materials, aluminum nitride (hereinafter simply referred to as AlN) has been noted as a stable insulation material of high electric resistance. There have been expected application uses, for example, as semiconductor insulation films for polycrystalline AlN, as SAW devices for single crystal AlN and as diffusion masks for amorphous AlN.

As the method of synthesizing AlN, while there may be considered reactive sputtering method, ion plating method, etc., a method of utilizing chemical vapor deposition (hereinafter simply referred to as CVD) may also be considered. Japanese Patent Application Sho 63-29678 which is a patent application prior to the present application discloses an example of a method for synthesized AlN by CVD. According to the method, aluminum, bromide (AlBr$_3$) is used as a source, which is supplied together with a hydrogen gas (H$_2$) into a reaction chamber. Further, a nitrogen gas (N$_2$) is supplied as an assist gas. For electrically discharging the gaseous mixture into plasmas, microwaves are used, for instance. When the gaseous mixture is subjected to electric discharge into plasmas, radical bondings comprising a combination, of, Al and Br, N and H, Al and N, or Al, Br and H are present. Further, the radical bondings in the combination described above are brought into a resonance state under excitation by the microwaves and under the effect of the microwaves to the specific dielectric constant and the angle of dielectric loss, and are separated into respective elements, in which Al, N, etc. are maintained in a thermodynamically equilibrium state. Then, they are reacted at the surface of a substrate to form thin AlN films.

However, in the method of synthesizing AlN by the plasma CVD described above, the reaction states and materials to be synthesized remarkably vary depending on various conditions, and stable synthesis has been possible only under the conditions within a narrow restricted range. Further, even if a stable synthesis can be obtained occasionally under a certain conditions, it is difficult to reproduce. Further, use of argon gas (Ar) for the synthesis of material by means of plasma CVD may also be considered. However, the argon gas has hitherto been considered as a means for establishing plasmas. In the case of using argon, the argon gas is usually supplied at first to a reaction chamber and then electrically discharged into plasmas, for example, by means of microwaves. Then, aluminum bromide or nitrogen gas is supplied as less decomposable material and, subsequently, the supply of the argon gas is interrupted. However, even with this method, no stable reactions can be obtained and reproducibility is poor.

Therefore, for improving the deposition rate, crystallinity, orientation factor, film quality, etc., the prior art, has mainly employed increasing substrate temperature, increasing the amount of starting material supplied or increasing the degree of vacuum reaction chamber. However, in a case of increasing substrate temperature, the temperature range capable of conducting satisfactory synthesis, for example of a film of material with a satisfactory orientation factor is extremely narrow, and setting the substrate temperature is difficult. Further, if the amount of the starting material supplied is increased, sputtering is likely to be caused, hindering the improvement in the deposition rate. Further, of increasing of the degree of leads to vacuum a reduction in the orientation factor in the AlN film formed.

The present invention has been achieved in order to overcome the foregoing problem in the prior art and it is an object thereof to provide a synthesis method by plasma CVD capable of stable synthesis within a wide range of conditions and providing a satisfactory orientation factor for the synthesized material.

SUMMARY OF THE INVENTION

The present invention concerns a synthesis method by means of plasma CVD of converting a reacting gas containing metal atoms into plasmas within a reaction chamber and depositing material containing the above-mentioned metal, wherein an inert gas is supplied from the outside of plasma region in the reaction chamber, as well as a synthesis method by means of plasma CVD of continuously supplying an inert gas at a constant flow rate in the means described above..

When an inert gas such as an argon (Ar) is supplied to a plasma region upon synthesis of material utilizing plasmas as described above, plasmas in the reaction chamber are stabilized. Further, when an inert gas such as argon is supplied from the outside of the plasma region, it is possible to form a preferred oriented film at a substrate temperature in a wider range. Further, films of preferred orientation can be obtained with a wide range of vacuum degree in the reaction chamber. Furthermore, the film deposition rate increased as compared with that in the conventional method. In addition, it is essential in this invention to supply an inert gas such as an argon gas from the outside of the plasma region. If the argon gas or the like is directly blown to the substrate from the nozzle in the plasma, sputtering is likely to occur to reduce the film deposition rate.

Thus, by supplying an inert gas such as an argon gas into plasmas, separation to neutral particles, ions, electrons, etc. in the plasmas is promoted. Moreover, in a coaxial line type of microwave plasma CVD, plasmas are put under the effect of electric fields and the plasma region is made not uniform because the electric field is strong in a tubular wall portion but is weaker in the central portion in which a substrate to be reacted is installed in the reaction chamber. However, by supplying the inert gas from the outside of the plasma region, the plasma region is extended. This is due to the fact that single atom molecules as in argon gas show less re-combination once decomposed in the plasmas and, if they are re-combined, they derive less energy from surroundings and continue stable decomposition It is, accordingly, assumed that this forms a sort of an ignition source to extend the plasma region. This is identical with the state in which the degree of vacuum is increased in usual plasma CVD and, moreover, it is possible to avoid the problem in the case of merely increasing the degree of vacuum, for example, the problem where the electron density is increased while the film deposition rate is reduced. With such an extended plasma region and improvement in the radical dissociation rate, stable synthesis is possible and the film-deposition rate is enhanced.

BRIEF DESCRIPTION OF THE DRAWINGS

These and other objects, as well as advantageous features of the present invention will become apparent by referring to examples thereof in conjunction with the accompanying drawings, wherein.

DESCRIPTION OF PREFERRED EMBODIMENTS

Example

The present invention is to be described by way of preferred examples.

Figure 1:
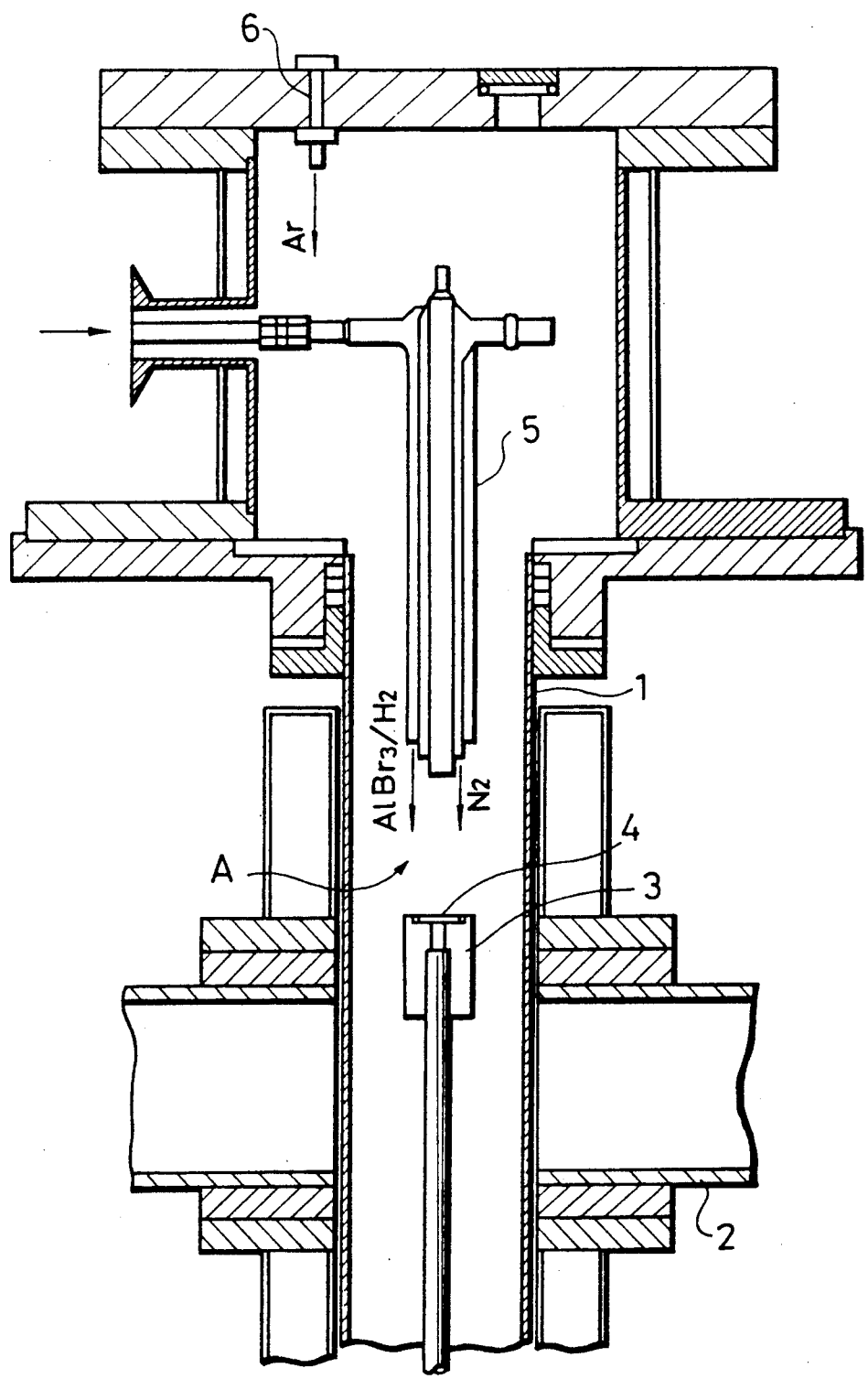
FIG. 1 is a longitudinal cross sectional view of a CVD apparatus used for the synthesis method according to the present invention.

FIG. 1 is a vertical cross sectionsl view illustrating a structure of a coaxial line type of microwave plasma CVD apparatus. In the drawing, a tubular reactor 1 comprises, for example, a quartz tube, the inside of which constitutes a reaction chamber A. A microwave guide 2 is connected to a microwave oscillator form which microwaves, for example, at 2.45 GHz are guided by a cyclotron and introduced by way of the wave guide 2 into the tubular reactor 1. A holder 3 is disposed within the reaction chamber A and a substrate 4 made of silicon 7Si) or the like is held on the holder 3. A gas supply nozzle 5 is disposed in the reaction chamber A toward the substrate 4. In the example shown in the drawing, the gas supply nozzle 5 comprises a multi-walled tube. Further, an inert gas supply nozzle 6 is disposed in the uppermost portion of the apparatus.

Description will now be made of a method of synthesizing a film of aluminum nitride (AlN) by using the apparatus described above.

At first, a gas mixture comprising aluminum bromide and hydrogen gas is supplied from the gas supply nozzle 5. At the same time, nitrogen gas is supplied from another tube of the gas supply nozzle 5 of a multi-walled tubular structure. Then, the gas is electrically discharged into plasmas by microwaves supplied from the wave guide 2. The argon gas is continuously supplied at a constant flow rate from the outside of the plasma region. In the plasmas, reactive species in the above-mentioned gas are reacted to each other to deposit a thin AlN film on the surface of the substrate 4.

Figure 2:
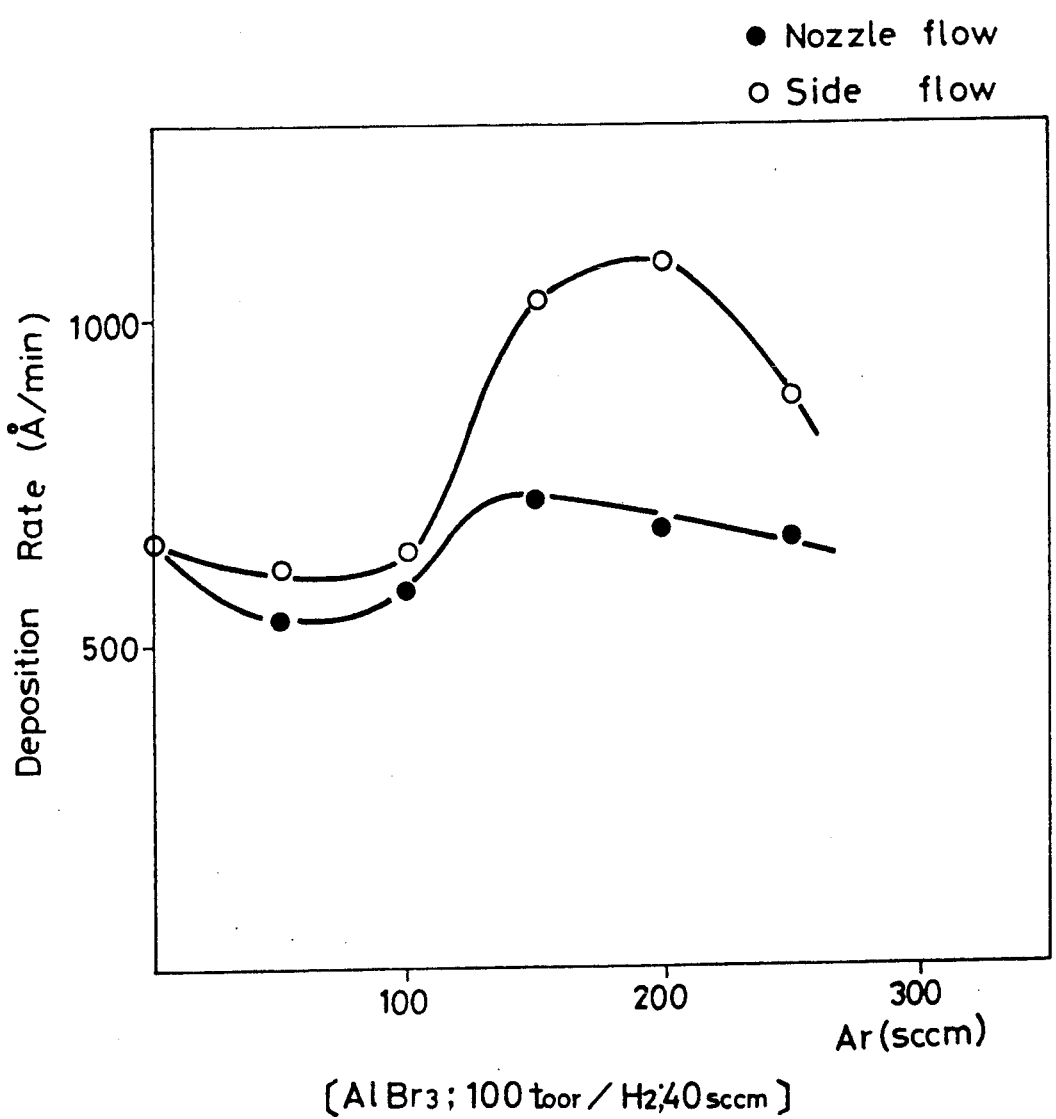
FIG. 2 is a graph illustrating a relationship between the flow rate of the argon gas supplied and the film deposition rate in the synthesis method according to the present invention.

FIG. 2 is a graph illustrating the relationship between a flow rate of the argon gas supplied and the deposition rate of AlN in the synthesis example described above.

In the synthesis method used as the basis for the graph, the coaxial line type of microwave plasma CVD apparatus shown in FIG. 1 is used, in which aluminum bromide (AlBr$_3$) is supplied at a gas pressure of 100 Torr and the hydrogen gas is supplied at a flow rate of 40 sccm. In the graph, open circles show a case in which an argon gas is supplied from the outside of a plasma region by using the rare gas supply nozzle 6 in the apparatus shown in FIG. 1, that is, a case of practicing the synthesis method according to the present invention, and full circles show a case in which an argon gases is blown to the substrate 4 through the identical supply path as the nitrogen gas supply tube in FIG. 1 for comparison with the present invention.

As can be seen from FIG. 2, in the case of supplying the argon gas from the outside of the plasma region, the film deposition rate is increased. Further, the deposition rate varies depending on the flow rate of the argon gas supplied and, in addition, the amount by which the deposition rate is increased is considerably greater at flow rates of the argon gas from about 150 sccm to 230 sccm. That is, by selecting the flow rate of the argon within the above-mentioned range, the film deposition rate can be increased. This is considered to be attributable to the that fact the radical dissociation rate is improved and the plasma region is extended by the supply of the argon gas. In the method according to the present invention, if the flow rate of the argon gas supplied is further increased to greater than 230 sccm, the film deposition rate is reduced, probably because sputtering is caused by the supply of the argon gas and the sputtering rate becomes greater than the film growth. Further, as shown by the full circles, in a case of directly blowing the argon gas to the substrate in the plasmas, the film deposition rate is remarkably reduced as compared with the case shown by the open circles. It is assumed to be attributable to the fact that sputtering is caused at the surface of the substrate and, in addition, the sputtering rate is increased.

As has been described above, by supplying the argon gas from the outside of the plasma region and by setting the flow rate to an optimum value, the plasma region can be extended and stabilized to improve the film deposition rate.

Further, quality of the synthesized film is much improved as compared with that in the conventional method. In a case of synthesizing AlN without supplying the argon gas in the apparatus shown in FIG. 1, C-axis oriented AlN films could be observed only occasionally upon synthesis under restricted conditions, and reproduction and setting of such conditions were difficult. On the contrary, by supplying the argon gas from the outside of the plasma region at a flow rate of 100 sccm, it was possible to widen the range for the synthesis condition for obtaining C-axis oriented AlN films.

Figure 3:
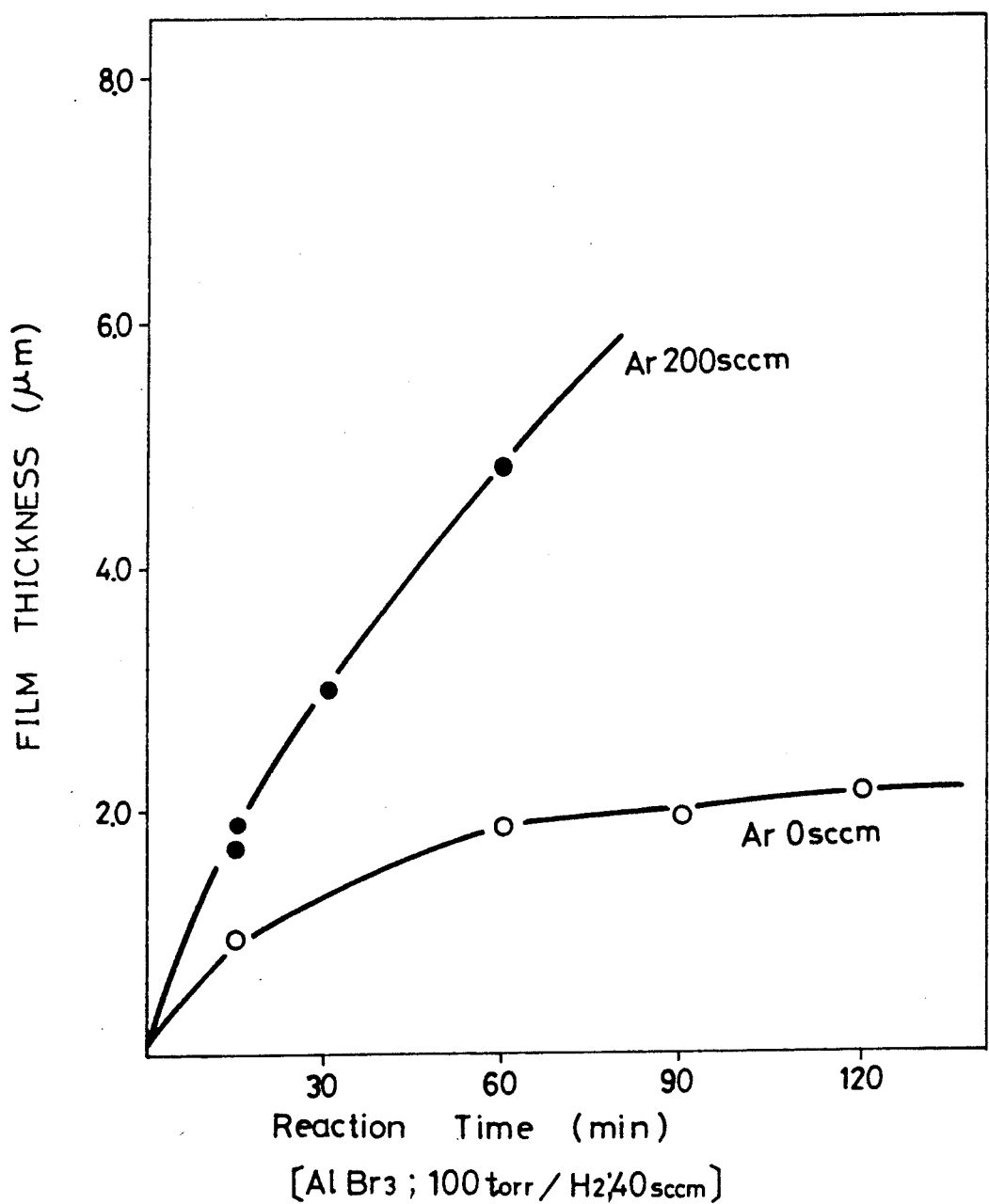
FIG. 3 is the graph illustrating a relationship between reaction time and film thickness.

FIG. 3 is a graph illustrating the relationship between reaction time and film thickness.

In the graph, full circles show a case of supplying an argon gas from the rare gas supply nozzle 6 at a flow rate of 200 sccm in the apparatus shown in FIG. 1, while open circles show a case of not supplying the argon gas. Conditions such as the gas pressure for aluminum bromide and the flow rate of the hydrogen gas supplied are identical with those shown in FIG. 2.

As shown by the above-mentioned graph, when the argon gas is supplied at an optimum flow rate from the outside of the plasma region, the film thickness is remarkably improved and it is possible to synthesize AlN of grater film thickness than was considered possible so far with the conventional method.

In addition, in the conventional synthesis method, the orientation factor of the AlN films varied greatly depending on the change of the flow rate of the nitrogen gas supplied. On the contrary, when the argon gas is supplied at an optimum flow rate, highly oriented AlN films could be obtained stably even when the flow rate of the argon gas varied.

The synthesis method according to the present invention is not restricted to the synthesis of aluminum nitride but it is possible to stabilize the synthesis and improve the quality of synthesized material in the same way also in the synthesis of other ceramics.

Further, although argon gas is supplied from the outside of the plasma region in the example mentioned above, the gas is not restricted to argon but any rare gas may be used with similar effect so long as it comprises single atom molecules and, it may be, for example, xenon (Xe), krypton (Kr) and helium (He).

As has been described above in the synthesis method according to the present invention, it is possible to stabilize the plasma and extend the plasma region thereby synthesizing ceramic films of excellent quality under stable conditions. In addition, it is possible to obtain thick film of high orientation, and ceramic films of excellent quality can be mass-produced.

What is claimed is:

1. A method of synthesizing metal-containing material by plasma chemical vapor deposition, which comprises the steps of:
    introducing a reactive gas containing metal atoms into a reaction chamber through at least one first inlet;
    converting said reactive gas into plasmas in said reaction chamber;
    supplying an inert gas into said reaction chamber through a second inlet, said second inlet being at a location spaced apart from said plasma region and said first inlet; and
    depositing said metal-containing material on a surface;
    wherein said inert gas is substantially pure and in a substantially unexcited state when it passes through said second inlet.

2. A synthesis method as defined in claim 1, wherein the inert gas is continuously supplied at a constant flow rate.

3. A synthesis method as defined in claim 1, wherein the reactive gas is converted into plasmas by means of microwaves.

4. A method of synthesizing aluminum nitride by plasma chemical vapor deposition, which comprises the steps of:
    introducing a gas containing aluminum bromide into a reaction chamber through at least one first inlet;
    converting said gas into plasmas in said reaction chamber;
    supplying argon into said reaction chamber through a second inlet, said second inlet being at a location spaced apart from said plasma region and said first inlet; and
    depositing aluminum nitride on a surface;
    wherein said argon is substantially pure and in a substantially unexcited state when it passes through said second inlet.

* * * * *

UNITED STATES PATENT AND TRADEMARK OFFICE
CERTIFICATE OF CORRECTION

PATENT NO. : 5,093,150
DATED : March 3, 1992
INVENTOR(S) : Yoshihiro Someno, Toshio Hirai and Makoto Sasaki It is certified that error appears in the above-indentified patent and that said Letters Patent is hereby corrected as shown below:

On the title page, item [73], change Assignee to read:
Alps Electric Co., Ltd., Tokyo, Japan; Toshio Hirai, Sendai, Japan; and Makoto Sasaki, Sendai, Japan Signed and Sealed this Eleventh Day of June, 1996

Attest:

BRUCE LEHMAN

Attesting Officer

Commissioner of Patents and Trademarks